United States Patent [19]

Yamaguchi et al.

[11] Patent Number: 4,663,592
[45] Date of Patent: May 5, 1987

[54] NMR IMAGE FORMING APPARATUS

[75] Inventors: Keiki Yamaguchi; Yuji Inoue; Hideto Iwaoka; Tadashi Sugiyama, all of Tokyo, Japan

[73] Assignees: Yokogawa Hokushin Electric Corporation; Yokogawa Medical Systems Limited, both of Tokyo, Japan

[21] Appl. No.: 737,719

[22] Filed: May 28, 1985

[30] Foreign Application Priority Data

Jun. 27, 1984 [JP] Japan .............................. 59-96333[U]

[51] Int. Cl.$^4$ ........................................... G01R 33/20
[52] U.S. Cl. ..................................... 324/315; 324/318
[58] Field of Search .............. 324/315, 318, 320, 300; 335/217, 299, 300; 336/179

[56] References Cited

U.S. PATENT DOCUMENTS

- 3,525,928  8/1970  Nagao et al. ......................... 324/315
- 3,921,060 11/1975  Ekimovoskikhe et al. ......... 324/315
- 4,587,492  5/1986  Laudermilch ....................... 324/318

OTHER PUBLICATIONS

B. K. Ratnikov, Powerful-Field Solenoid with Water Cooling, Instrum. & Exp. Tech., vol. 14, No. 5, Sep.-Oct. 1971.

Primary Examiner—Stewart J. Levy
Assistant Examiner—Scott M. Oldham
Attorney, Agent, or Firm—Moonray Kojima

[57] ABSTRACT

The static magnetic fields of an NMR imaging apparatus should be maintained constant in intensity in order to obtain satisfactory NMR images. Coils used to generate the static magnetic fields, and the supporting frames therefor, are subject to heat expansion due to changes in the temperature, which causes fluctuations in the intensity of the generated static magnetic fields. In the invention, the temperatures of the coils, frames, atmosphere and cooling water, and the amount of cooling water, are detected, and the energizing current for the static magnetic field coils is selectively controlled, based on the detected quantities, to thereby maintain constant the intensity of the generated static magnetic fields.

2 Claims, 5 Drawing Figures

NMR IMAGE FORMING APPARATUS

BACKGROUND OF THE INVENTION

1. Field of Invention

This invention relates to nuclear magnetic resonance (called "NMR") image forming apparatus, used, for example, in medical equipment, which determines the distribution of certain nuclei of atoms or the like, in a subject to be examined, from the outside of such subject, by utilizing NMR.

2. Description of the Prior Art

In an NMR image forming apparatus, an image of the inside of a subject to be examined, is obtained by placing the subject within magnetic fields which are generated by supplying electric current to a coil which forms static magnetic fields, and by supplying an electrical current at an RF frequency to an RF coil, which applies RF magnetic fields at a predetermined angle to the subject. The results are processed by a computer. In this case, the intensity of the static magnetic fields should be maintained constant in order to obtain a satisfactory NMR image. For example, when a water cooled type 4 coil ordinary conductive type magnet is used to generate a static magnetic field, the current supplied to the coil which generates the static magnetic field is kept at a predetermined level by the use of a constant current source.

However, even use of a constant current source is not entirely satisfactory since changes in temperature will affect the magnetic field intensity. For example, if there is any change in the temperature of the coils, frame, atmosphere, or cooling water, or any change in the amount of cooling water, the temperatures of the coils and support frame will also be changed. This results in the fluctuation of the intensity of the static magnetic fields due to, for example, the deformation of the coils and the frame caused by heat expansion. This results in a deterioration of the NMR image.

SUMMARY OF THE INVENTION

Accordingly, an object of the invention is to overcome the aforementioned and other deficiencies and disadvantages of the prior art.

Another object is to provide an NMR image forming apparatus which is capable of automatically correcting any degradation of an NMR image resulting from the deformation of the coils or the like due to, for example, heat expansion.

DETAILED DESCRIPTION OF PREFERRED EMBODIMENTS

Figure 1:
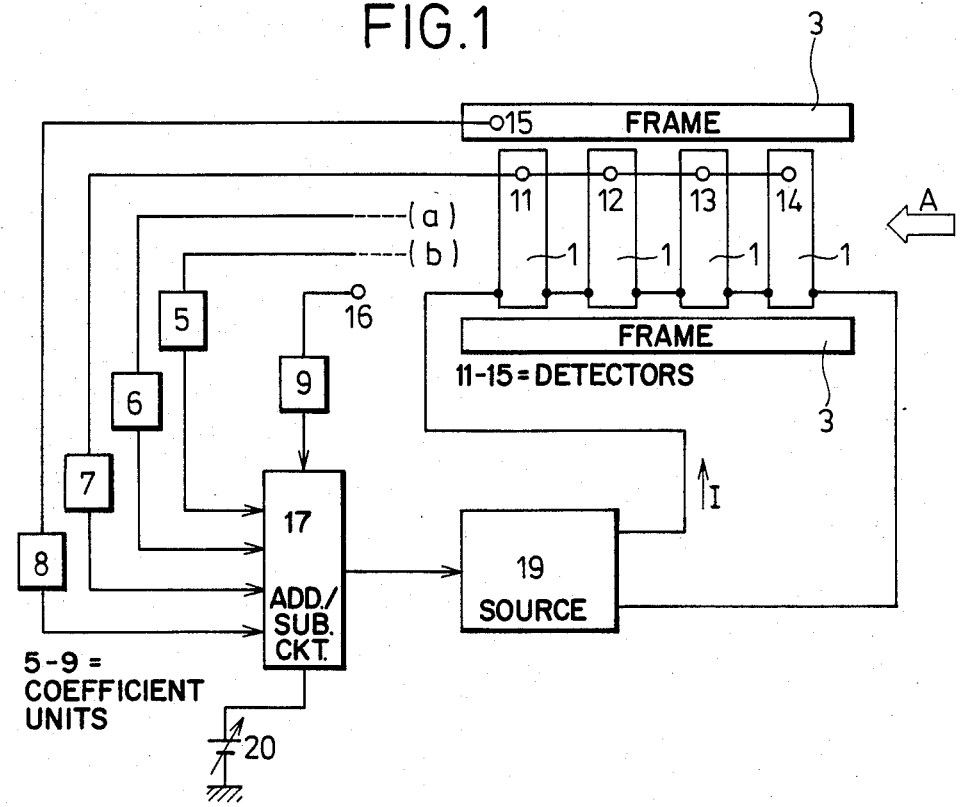
FIG. 1 is a diagram depicting an illustrative embodiment of the invention.
Figure 2:
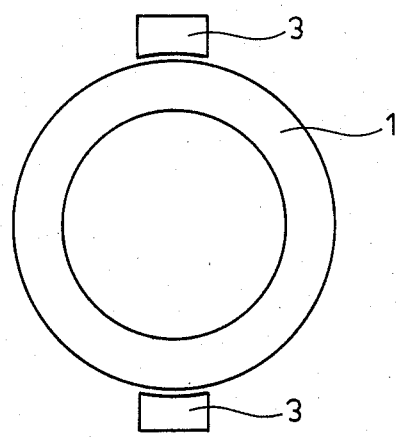
FIG. 2 is an elevational view of a magnetic coil as seen along arrow A of FIG. 1.

FIG. 1 depicts an NMR imaging apparatus comprising magnetic coils 1 for generating static magnetic fields. Although four magnetic coils are shown, the invention is not restricted to such number. Each coil comprises several turns of conductor wires, such as of copper. The four magnet coils 1 may be connected electrically to each other in series or in parallel as desired. Cooling water is supplied to the periphery of the coils for cooling the coils, although such cooling water or means for holding and circulating same are not shown in this figure, for sake of convenience and simplicity of description. The coils 1 are supported by frames 3. The frames 3 and coils 1 are arranged as shown in FIG. 2.

Specifically, each of the magnetic coils is in a ring like configuration and the four coils are supported by the frames 3. Although coil 1 is of annular configuration, the structure of frame 3 is not restricted to such shape and may be of any suitable shape, such as circular.

Although not depicted in FIG. 1, for sake of simplicity of description, the NMR apparatus will have a RF coil which receives RF signals and generates RF fields which are suitably directed, and a RF receiving coil which receives the RF based NMR signal and transmits same to a computer for processing.

Coefficient units 5-9 are set depending on the temperature coefficients or the like of magnetic coils 1 and frames 3, as will be described hereinafter in greater detail. Temperature detector devices 11-16 are disposed as depicted onthe coils 1 and frame 3, to detect the temperatures at the respective positions. The detectors 11-14 detect the temperature at each of the magnet coils. The detector 15 detects the temperature at the frame 3. The detector 16 detects the atmospheric temperature. Each of the detectors used herein is of a type known per se.

Connected to the coefficient units 5-9 is an adder/subtractor circuit (called A/S circuit) 17 for adding and/or subtracting signals supplied by coefficient units 5-9. The A/S circuit 17 is connected to and controls current source 19 which supplies an electrical current to each of the magnetic coils 1. The source 19 controls the value of current I based on the signal from the A/D circuit 17 and a reference voltage from source 20, to be described later.

In FIG. 1, terminal (a) denotes a source of a signal which is related to the temperature of the cooling water for the coil. Terminal (b) denotes a source of a signal which is related to the amount of cooling water. The signal from source (a) is applied by way of coefficient unit 6 and the water amount signal from source (b) is applied by way of coefficient unit 5, both being applied to adder/subtractor circuit 17, respectively. A reference voltage from source 20 is supplied to A/S circuit 17, and is used to control current I supplied to the coils.

The illustrative embodiment of FIG. 1 operates as follows: When the average temperature of coils 1 rises by 1° C., for example, the magnetic fields are reduced by about 5 ppm at the central region of the coils due to the heat expansion of the copper material comprising the coils. Similarly, when the temperature of frames 3 rises by 1° C., the interval between the coils 1 is enlarged due to the heat expansion of the frames. This results in a reduction of the magnetic fields by about 15 ppm at the central region of the coils 1.

Calculations were made using a typical configuration of resistive magnets under these conditions (1) each coil was made of copper, (2) the diameter of each coil was 1,000 mm, (3) the coefficient of linear thermal expansion was $16.7 \times 10^{-6}$ (alpha=$16.7 \times 10^{-6}$) and (4) the temperature and diameter of each coil was varied uniformly. The changes in magnetic field strength was measured. The frames were made of aluminum. Calculations were made under these conditions (1) coefficient of thermal linear expansion was $23 \times 10^{-6}$ (alpha=$23 \times 10^{-6}$), (2) distance between the center of one coil and the center of the coil system was 18 cm. The distance between the center of another coil and the center of the coil system was 55 cm. Thus, temperature change in the frame has a greater effect than a change in the temperature in the coil. To put it another way changes in the space between the coils produce larger changes in the magnetic field strength than changes in the coil diameter, and with the different coefficients of linear expansion, temperature changes in the frame has a greater effect than in the coil.

A subject to the examined is disposed within a circular configuration formed by the four annular magnetic coils 1. When a constant current I is supplied from current source 19 to each of coils 1, static magnetic fields are generated inside of the cylindrical configuration.

In this invention, the temperature detection devices 11–15 are disposed on each of the coils 1 and the frames 3. These detectors 11–15 are set to the values corresponding to the temperature coefficient of coils 1 and frames 3, so that the detected results may be matched between those with larger temperature coefficients and smaller temperature coefficients. The outputs from the devices 11–15 are collected by coefficient units 7,8 and the addition value thereof is used an operated upon by A/S circuit 17 to control current source 19. Thus, the current I is controlled in accordance with changes in temperatures of the magnetic coils and/or the frames, to suppress any fluctuations in the magnetic field $H_O$. Specifically, if the magnetic field $H_o$ which is applied to the subject varies because of the changes in temperatures, the above described embodiment will react and cause the magnetic fields to be applied at a constant intensity to the subject, by controlling the value of the current I supplied to the coils 1.

Since the temperature of frame 3 is changed under the effect of the atmospheric temperature, the atmospheric temperature may be measured instead of the temperature of the frames 3, as shown by temperature detector 16, which may be used to effect the correction.

Furthermore, since the temperature of coils 1 reflects the temperature of the cooling water, the amount of cooling water, the atmospheric temperature and the amount of air flow rate, these values may also be used for the correction as shown representationally by sources (a) and (b).

Also, since the temperature for each of the portions of the coils 1 is not aways uniform, a plurality of temperature detection devices may be disposed at various respective positions thereon.

Figure 3:
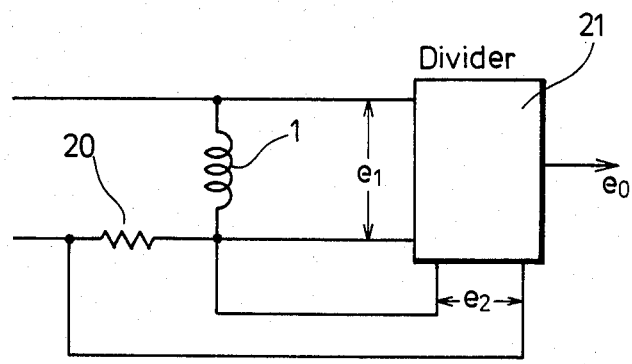
FIGS. 3 and 4 are diagrams depicting devices for measuring the temperature of the magnetic coils indirectly, based on the resistance valve thereof.
Figure 4:
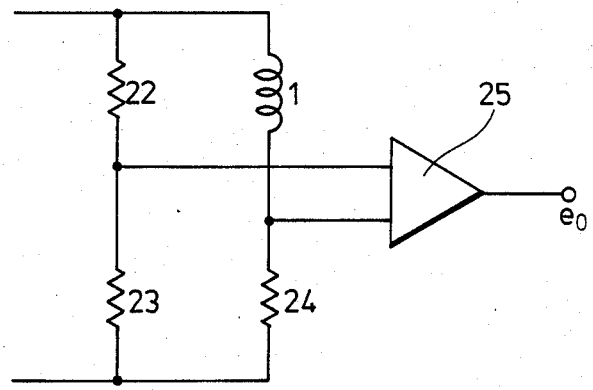

Instead of using a plurality of temperature detection devices the changes in the electrical resistance of coils 1 may be measured by devices shown in FIGS. 3 and 4, and the measured value may be used for the correction as an average temperature of the coils while refering to the temperature coefficient of known electrical resistance.

The measuring circuit of FIG. 3 comprises magnetic coil 1 (e.g. of FIG. 1), a shunt resistance 20 and a divider 21. Assuming the inputs to divider 21 are e1 and e2, the output e0 from divider 21 represents the resistance of the magnet coil 1. That is, e0=e1/e2.

The measuring circuit of FIG. 4 comprises resistances 22–24 and a magnetic coil 1 (e.g. of FIG. 1), constituting together, a bridge circuit, and a voltage across the bridge sides is taken out by way of an amplifier 25. Specifically, output e0 from amplifier 25 represents the fluctuations in the resistance value of the coil 1.

FIG. 1 depicts an embodiment wherein all of the factors are taken into consideration, that is, the temperature of coils 1, the temperature of frames 3, the temperature of cooling water, the amount of water, and the atmospheric temperature. In this case, since the variations between the temperature coefficients for each of the portions are adjusted by the respective coefficient units 5–9, the A/S circuit 17 is provided for adding and subtracting values from the respective coefficient units, and control is effected, using the reference voltage 20, of current source 19.

However, it is not always necessary in this invention to detect all of these parameters for the control of current I. Current I can be controlled based on only one of the above parameters. In that case, the problems above outlined, are sill significantly improved. That is, it is only necessary in this invention to detect at least one of the above parameters for controlling the current I.

In FIG. 1, the embodiment controlling the current I depends on the changes in the temperature of each of the portions depicted and on the amount of water, so that undesired effects of these fluctuations may be corrected.

Figure 5:
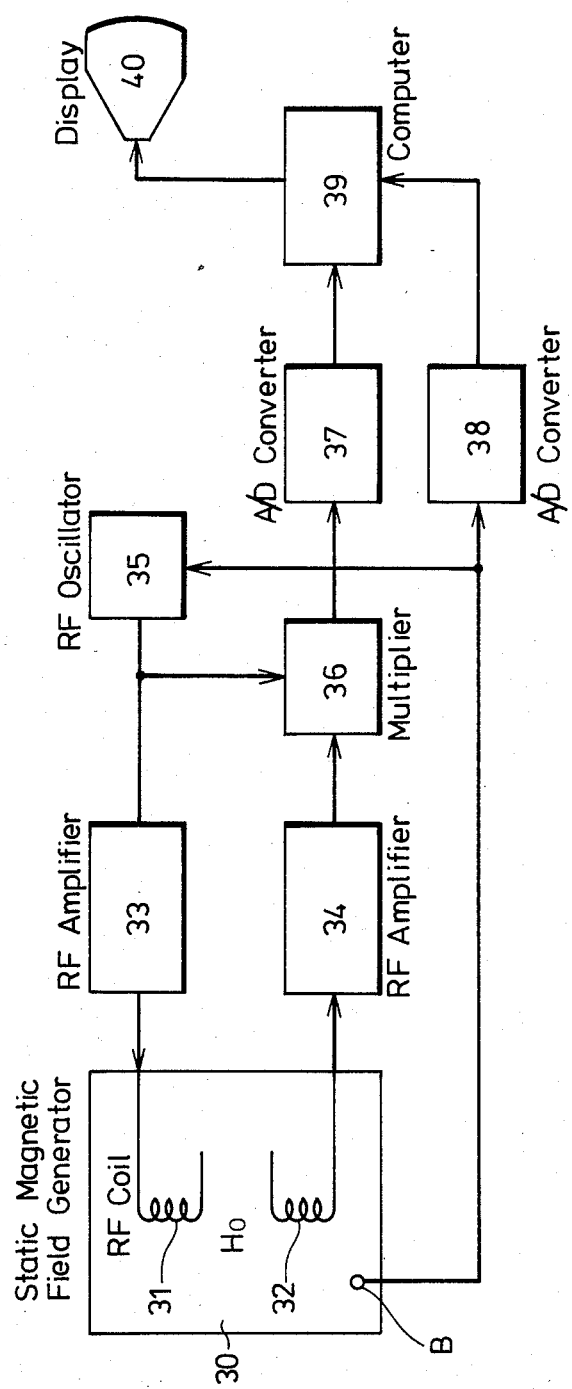
FIG. 5 is a diagram depicting another illustrative embodiment of the invention.

FIG. 5 depicts another illustrative embodiment comprising a static field generating device 30 which comprises similar magnetic coils, frames and the like, as in FIG. 1, and which generates magnetic fields H0 as the static magnetic fields and RF coils 31,32. The RF magnetic fields generated by the RF coils are constituted so as to make a predetermined angle relative to the static magnetic fields H0. Connected to generator 30 is RF amplifier 33 which is used for applying a current of an appropriate value to RF coil 31. Connected to generator 30 is amplifier 34 which is used for amplifying a signal relevant to the NMR phenomenon detected by RF coil 32 and for supplying the amplified signal to the succeeding stage. RF amplifier 35 is connected to amplifier 33 and to multiplier 36. Multiplier 36 is connected to A/D converter 37, which converts analog signals into digital signals and then to computer 39. Computer 39 functions to receive data based on the NMR phenomenon in each of the sections of the subject through the A/D converter 37 and outputs image data representing the insider of the subject based thereon, to a display 40, which may be, for example, a CRT (cathode ray tube). Terminal B of generator 30 comprises a device for measuring various kinds of parameters, such as those above discussed in FIG. 1 (for example, temperature for magnetic coils, temperature for frame, temperature for cooling water,etc.) Terminal B is connected to oscillator 35 and A/D circuit 38 which converts the analog to digital signal and supplies computer 39 with the signals of the parameters obtained from the generator 30. The parameters are also supplied to oscillator 35 to selectively control the RF signal frequency supplied to coil 31.

In the arrangement of FIG. 5, components other than B have been used in prior arrangements. Accordingly, only a brief discussion is set forth below of the NMR imaging operation.

It has been known that the nuclei (the atomic number or mass number of which is an odd number) in the static magnetic fields $H_0$, conduct the precession and the NMR frequency $\omega_0$ (Larmor frequency) is represented as $\omega_0 = \gamma \cdot H_0$. It is in proportion with the static magnetic fields $H_0$. In the above equation, $\gamma$ is the gyromagnetic ratio of the constant representing the nature of the nuclei. Accordingly, by detecting the temperature of the magnetic coil or the like, using the detector device represented by terminal B, thereby correcting the RF frequency $\omega$ of the RF oscillator 35 by $\gamma \cdot \Delta H$ corresponding to the temperature fluctuation $\Delta H$ of the static magnetic field $H_0$, the effects of the fluctuations in the magnetic field intensity $H_0$, if any, on the NMR image can be decreased.

Alternatively, the temperature signals for the magnetic coils or the like detected by the detector means represented by terminal B may be analog-to-digital converted by the A/D converter 38 which are supplied as data to computer 39. Then, computer 39 with suitable programming will perform mathematical operations to shift the Fourier spectrum of the RF signal detected by the RF coil 32 by $\gamma \cdot \Delta H$, by which maneuver the effect of the fluctuations in the magnetic field intensity $H_0$ on the NMR image will also be reduced.

In the foregoing illustrative embodiments depicted in FIGS. 1 and 5, the temperature induced distortions are corrected by taking the temperatures of various parts and taking various coefficients and reference voltages and then adjusting the current source to produce a constant magnetic field intensity on the subject, or adjusting the RF current applied to an RF coil, or mathematically adjusting the results. These three operative methods may be used singly or in any combination, by using suitable components.

As described above mechanism is provided for compensating for the degradation in the NMR image caused by fluctuations in the intensity of the static magnetic fields $H_0$ due, for example, to changes in the temperature of the magnetic coils, the temperature of the frames for supporting the coils, the temperature of the water for cooling the magnetic coils, the amount of the cooling water, and the like. By varying the foregoing parameters through computer operations, the undesired effects derived therefrom can be minimized.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. In an NMR image forming apparatus comprising
at least one magnetic coil for forming a static magnetic field;
current means for supplying current to said magnetic coil;
cooling means for cooling said magnetic coil with cooling liquid;
at least one RF coil;
means for supplying RF current to said RF coil;
wherein said magnetic coil, said frame and said RF coil are shaped and disposed to hold a subject to be examined in a position whereat NMR can be efected on said subject; and
the improvement comprising
detector means for detecting temperature changes of at least one of said magnetic coil, said cooling means and said frame, and for detecting amount of said cooling liquid; and
control means responsive to said detector means for the frequency of said RF current supplying means to thereby compensate for any changes in temperature or liquid.

2. In an NMR image forming apparatus comprising
at least one magnetic coil for forming a static magnetic field;
current means for supplying current to said magnetic coil;
a frame for holding said magnetic coil;
cooling means for cooling said magnetic coil with cooling liquid;
at least one RF coil;
means for applying RF current to said RF coil;
wherein said magnetic coil, said frame and said RF coil are shaped and disposed to hold a subject to be examined in a position whereat NMR can be effected on said subject; and
means for processing NMR signals obtained from said subject; and
the improvement comprising
detector means for detecting temperature changes of at least one of said magnetic coil, said cooling means and said frame and for detecting amount of said cooling liquid; and
control meansrresponsive to said detector means for mathematically correcting said processed results to compensate for any changes of temperature or liquid amount.

* * * * *